(12) United States Patent
Ogawa et al.

(10) Patent No.: US 6,784,474 B2
(45) Date of Patent: *Aug. 31, 2004

(54) SEMICONDUCTOR MEMORY DEVICE AND METHOD FOR FABRICATING THE SAME

(75) Inventors: Hisashi Ogawa, Osaka (JP); Yoshihiro Mori, Osaka (JP); Akihiko Tsuzumitani, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 61 days.

This patent is subject to a terminal disclaimer.

(21) Appl. No.: 10/203,430

(22) PCT Filed: Dec. 28, 2001

(86) PCT No.: PCT/JP01/11672

§ 371 (c)(1), (2), (4) Date: Aug. 8, 2002

(87) PCT Pub. No.: WO02/056383

PCT Pub. Date: Jul. 18, 2002

(65) Prior Publication Data

US 2003/0012117 A1 Jan. 16, 2003

(30) Foreign Application Priority Data

Jan. 5, 2001 (JP) ........................ 2001-000409

(51) Int. Cl.[7] .............................................. H01L 29/76
(52) U.S. Cl. ..................... 257/295; 257/68; 257/71; 257/296; 257/298; 257/905; 257/908
(58) Field of Search .................. 257/68–71, 295–313, 257/905–908

(56) References Cited

U.S. PATENT DOCUMENTS

| | | | | | |
|---|---|---|---|---|---|
| 5,665,624 | A | * | 9/1997 | Hong | 438/244 |
| 5,946,571 | A | * | 8/1999 | Hsue et al. | 438/255 |
| 5,998,251 | A | * | 12/1999 | Wu et al. | 438/241 |
| 6,049,103 | A | * | 4/2000 | Horikawa et al. | 257/303 |
| 2003/0015742 | A1 | * | 1/2003 | Ogawa et al. | 257/296 |
| 2003/0015743 | A1 | * | 1/2003 | Ogawa et al. | 257/296 |

FOREIGN PATENT DOCUMENTS

| | | | |
|---|---|---|---|
| JP | 5-326551 | A | 12/1993 |
| JP | 8-8349 | A | 1/1996 |
| JP | 8-222709 | A | 8/1996 |
| JP | 10-256505 | A | 9/1998 |
| JP | 2001-244435 | A | 9/2001 |

* cited by examiner

Primary Examiner—David Nelms
Assistant Examiner—Andy Huynh
(74) Attorney, Agent, or Firm—McDermott Will & Emery LLP

(57) ABSTRACT

A memory cell in a DRAM, which is a semiconductor memory device, is provided with a bit line 21a connected to a bit line plug 20b and a local interconnect 21b, over a first interlevel insulating film 18. A conductor sidewall 40 of TiAlN is formed on side faces of hard mask 37, upper barrier metal 36, Pt film 35 and BST film 34. No contact hole is provided on the Pt film 35 constituting an upper electrode 35a. The upper electrode 35a is connected to an upper interconnect (a Cu interconnect 42) via the conductor sidewall 40, dummy lower electrode 33b, dummy cell plug 30 and local interconnect 21b. The Pt film 35 is not exposed to a reducing atmosphere, and therefore deterioration in characteristics of the capacitive insulating film 34a can be prevented.

12 Claims, 7 Drawing Sheets

SEMICONDUCTOR MEMORY DEVICE AND METHOD FOR FABRICATING THE SAME

TECHNICAL FIELD

The present invention relates to semiconductor memory devices and methods for fabricating the same. More particularly, the present invention relates to structures for memory cells that include high-κ films or ferroelectric films.

BACKGROUND ART

Recently, embedded-DRAM processes for combining DRAMs with high-performance logic circuits have been put into practical use in multimedia applications requiring large memory capacity and high data transmission speed.

To form the capacitive insulating films for capacitors that serve as memory capacitors, DRAM processes to date, however, require a high-temperature heating process. Thus, a drawback of these processes to date have been that the impurities in the doped layers of the transistors included in the high-performance logic circuit have an undesirable concentration profile. Moreover, in downsizing the memory-cell transistors in DRAM, FeRAM, and like processes that use a single memory, high-temperature heating processes are preferably avoided as completely as possible.

Avoiding high-temperature heating processes requires developing MIM (Metal-Insulator-Metal) capacitors using high-κ films which can be formed at low temperature and which enable downsizing of the memory cells. As the high-κ films, perovskite-structured BST ((BaSr)$TiO_3$) films and like dielectric films are used. Meanwhile, Pt, which has high oxidation resistance, is generally expected to hold promise as a material used for the metal electrodes in MIM capacitors. Also, as ferroelectric films, perovskite-structured SBT (Sr$Bi_2Ta_2O_9$) films, BTO ($Bi_4Ti_3O_{12}$) films, and like dielectric films are often used.

Problems to be Solved

MIM capacitors serving as memory capacitors have, however, had the following problems to date.

First, when contact holes that are in contact with Pt-electrodes (upper electrodes) provided on the capacitive insulating film are formed, the characteristics of the capacitor may be adversely affected by, for example, the reducing atmosphere under which the contact plugs are formed. This is because a deficiency of oxygen may arise in the dielectric film due to the reducing atmosphere, since the dielectric film is generally made of an oxide. If the capacitive insulating film is a high-κ film or a ferroelectric film, there is an especially strong likelihood that oxygen deficiency will occur. In particular, in dielectric films having a perovskite structure, the characteristics deteriorate markedly due to oxygen deficiency.

Likewise, in devices such as DRAMs, which conventionally do not use Pt-electrodes, manufacturing process steps, such as forming the contacts, for Pt-electrodes, which are novel materials, are difficult to perform with existing equipment used for other process steps, making it necessary to run special facilities. Specifically, in a situation in which a contact hole reaching to a Pt electrode is formed in an interlayer dielectric film, for example, Pt will be sputtered from the exposed Pt-electrode, and therefore the Pt will be adhered to, e.g., walls of the chamber or components within the chamber. If the chamber is used as it is, the Pt may invade active regions in the transistors, adversely affecting the transistors' operation.

DISCLOSURE OF INVENTION

An object of the present invention is to provide a semiconductor memory device with an MIM capacitor having excellent characteristics and a method for fabricating the same by providing a means for forming an interconnect layer which is not in direct contact with, i.e., is indirectly connected to, an upper electrode made of, for example, Pt on an capacitive insulating film.

Another object of the present invention is to provide a semiconductor memory device that requires no special equipment and, therefore, can be fabricated at low cost and a method for fabricating the same.

An inventive semiconductor memory device includes: a memory capacitor, which is formed on an insulating layer over a semiconductor substrate and includes a lower electrode, an upper electrode, and a capacitive insulating film sandwiched between the lower electrode and the upper electrode; an extension of the upper electrode and an extension of the capacitive insulating film extending respectively from the upper electrode and the capacitive insulating film of the memory capacitor; a dummy conductor member formed to be partly located under the upper-electrode extension and the capacitive insulating film extension; a conductor sidewall formed on side faces of the upper-electrode extension and the capacitive-insulating-film extension and connected to the dummy conductor member; and an upper interconnect electrically connected to the dummy conductor member.

According to this structure, the upper interconnect is not necessarily directly connected to the upper electrode. Thus, even if the upper electrode is made of a Pt film, for example, it is possible to prevent deterioration in characteristics of the capacitive insulating film resulting from exposure of the capacitive insulating film to the reducing atmosphere.

The conductor sidewall may cover the side faces of the upper-electrode extension and the capacitive-insulating-film extension to surround the entire circumference of films that include the upper electrode and extension thereof, and the capacitive insulating film and extension thereof, respectively. Then, it is ensured that the reducing atmosphere is prevented from invading the capacitive insulating film.

It is preferable that the dummy conductor member is a dummy lower electrode, the dummy lower electrode and the lower electrode being made from an identical conductor film; and the conductor sidewall electrically connects the upper-electrode extension to the dummy lower electrode.

The device may include: a bit line formed under the memory capacitor with the insulating layer sandwiched between the bit line and the memory capacitor; a local interconnect, the local interconnect and the bit line being made from an identical conductor film; and a conductor plug formed through the insulating layer to connect the dummy lower electrode to the local interconnect. Then, a structure suitable for a memory with a "capacitor over bit-line" construction can be obtained utilizing the conductor film for the bit line.

The device may include: an isolating insulating film formed in the semiconductor substrate under the insulating layer; a memory cell transistor formed in a region of the semiconductor substrate surrounded by the isolating insulating film, the memory cell transistor including a gate electrode and doped layers defined within the semiconductor substrate below the gate electrode to horizontally sandwich the gate electrode therebetween; a local interconnect formed on the isolating insulating film, the local interconnect and the gate electrode being made from an identical conductor film; and a conductor plug formed through the interlevel insulating film to be connected to the local interconnect. Then, a structure suitable for both memories with "capacitor over bit-line" and "capacitor under bit-line" constructions can be obtained utilizing the conductor film (e.g., a polysilicon film) for the gate electrode.

The device may include: a memory cell transistor formed in a region of the semiconductor substrate, the memory cell transistor including a gate electrode and doped layers defined within the semiconductor substrate below the gate electrode to horizontally sandwich the gate electrode therebetween; a local interconnect made of another doped layer to be separated from the doped layers defined within the semiconductor substrate; and a conductor plug formed through the insulating film and connected to the local interconnect. Then, a structure suitable for both memories with "capacitor over bit-line" and "capacitor under bit-line" constructions can be obtained utilizing a process for forming source/drain regions.

The dummy conductor member may be a local interconnect made of a conductor film filling in a trench that is formed in the insulating layer. Then, a structure suitable for both memories with "capacitor over bit-line" and "capacitor under bit-line" constructions can be obtained.

The dummy conductor member may be a dummy lower electrode, the dummy conductor member and the lower electrode being made from an identical conductor film; the conductor sidewall may be in contact with the upper-electrode extension and the dummy lower electrode; and the upper interconnect may be in contact with the dummy lower electrode. Then, a relatively simple structure suitable for both memories with "capacitor over bit-line" and "capacitor under bit-line" constructions can be obtained.

The lower electrode, the capacitive insulating film and the upper electrode of the memory capacitor may be cylindrical. Then, a semiconductor memory device in which memory cells are relatively densely arranged is implemented.

An inventive method for fabricating a semiconductor memory device, which includes a memory capacitor and an upper interconnect, the memory capacitor including a lower electrode, an upper electrode and a capacitive insulating film sandwiched between the lower and upper electrodes, the upper interconnect being electrically connected to the upper electrode of the memory capacitor, includes the steps of: a) forming a first conductor film on an insulating layer over a semiconductor substrate, and then patterning the first conductor film to form the lower electrode and a film for a dummy lower electrode in mutually separated positions; b) forming a dielectric film covering the lower electrode and the dummy film; c) forming a second conductor film covering the dielectric film; d) forming, over the second conductor film, an etching mask covering the whole of the lower electrode and part of the dummy film; e) patterning the second conductor film, the dielectric film and the dummy film, thereby forming the capacitive insulating film and an extension of the capacitive insulating film from the dielectric film, forming the upper electrode and an extension of the upper electrode from the second conductor film, and forming a dummy lower electrode from the dummy film; and f) depositing a third conductor film over a substrate and then anisotropically etching back the third conductor film, thereby forming a conductor sidewall covering exposed parts of respective side faces of the second conductor film, the dielectric film and the dummy lower electrode, after the step e) has been performed.

According to this method, in the step a), a dummy lower electrode is formed concurrently with the formation of a lower electrode for a memory capacitor, and then the lower electrode and the dummy lower electrode are connected to each other via a conductor sidewall in the step f). In addition, it is unnecessary to increase the number of photolithographic process steps between the steps of a) and f).

In the step d), a hard mask may be formed as the etching mask. Then, accuracy in patterning can be improved in the step e).

The method may include, before the step a) is performed, the steps of: forming an insulating film for forming steps therein on the insulating layer; and forming, in the insulating film for forming steps, a first opening in which the memory capacitor is to be formed, and a second opening in which the dummy lower electrode is to be formed. In this method, in the step a), the lower electrode may be formed on the side and the bottom of the first opening, and the dummy lower electrode may be formed on the side and the bottom of the second opening. In the step d), the etching mask may be formed to cover only part of the second opening. Then, a semiconductor memory device in which memory cells are relatively densely arranged is implemented.

BEST MODE FOR CARRYING OUT THE INVENTION

Embodiment 1

In this embodiment, an example of how the present invention is applied to a DRAM memory cell structure where a bit line is located under a memory capacitor, which is also called a "capacitor over bit-line" construction, will be described.

Figure 1A:
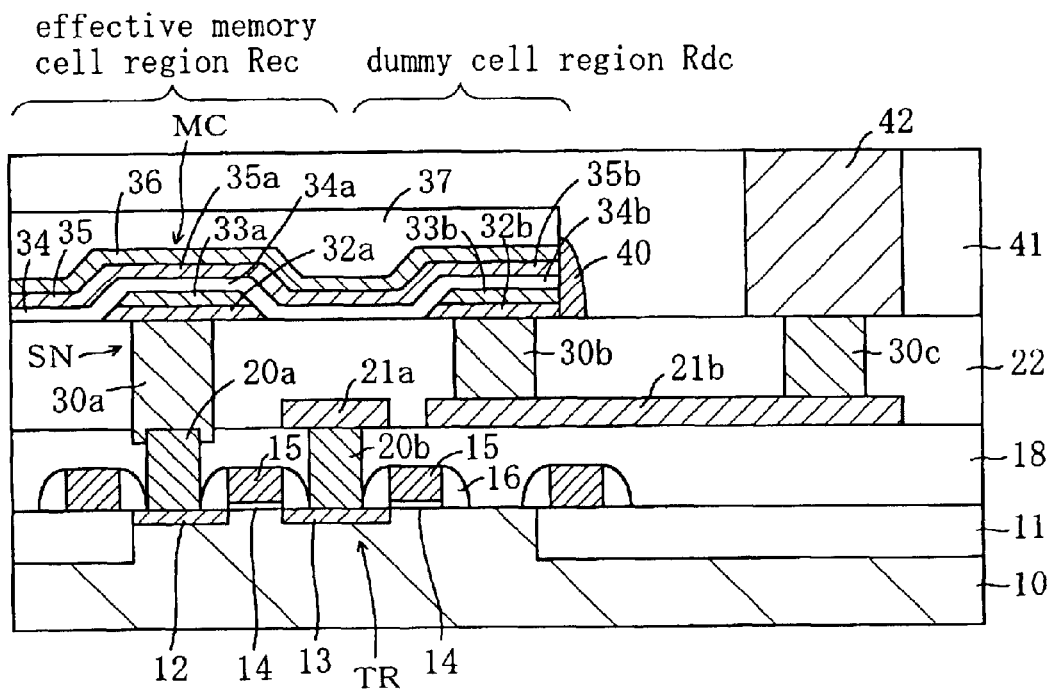
FIGS. 1(a) and 1(b) are, respectively, a cross-sectional view partly showing a structure of a memory part of and a plan view of a structure including upper electrodes and a conductor sidewall in, a semiconductor memory device according to a first embodiment of the present invention.
Figure 1B:
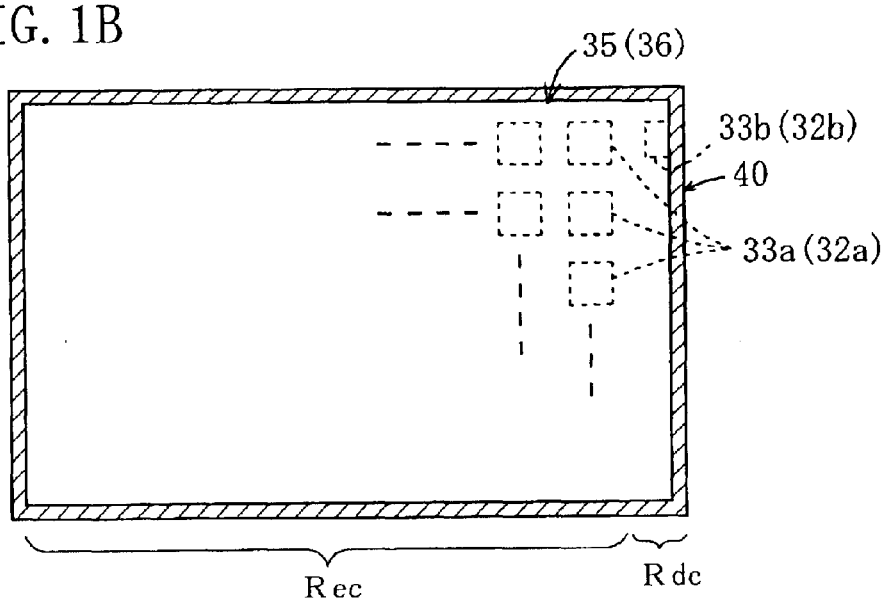
Figure 2A:
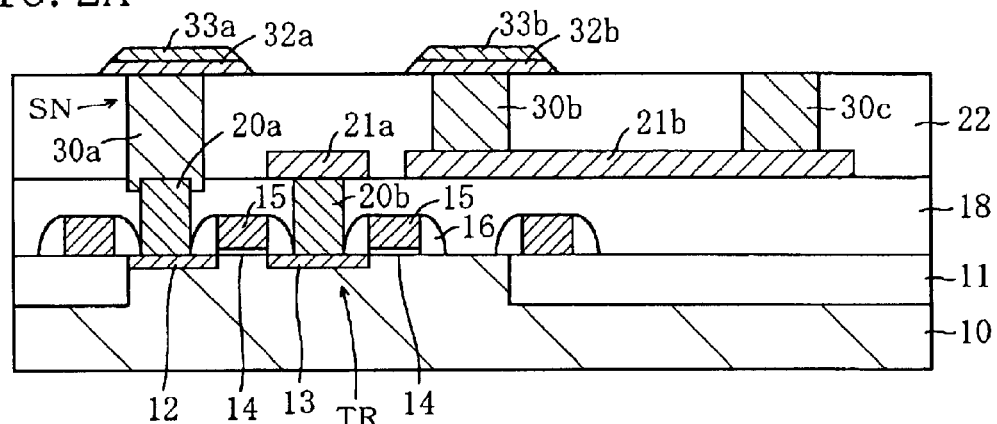
FIGS. 2(a) through 2(c) are cross-sectional views showing respective process steps for fabricating the semiconductor memory device of the first embodiment.
Figure 2B:
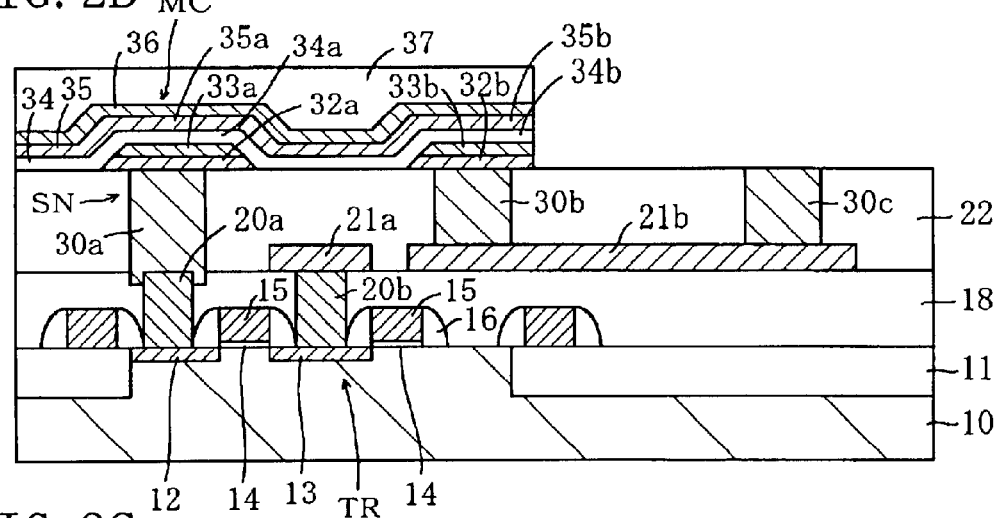
Figure 2C:
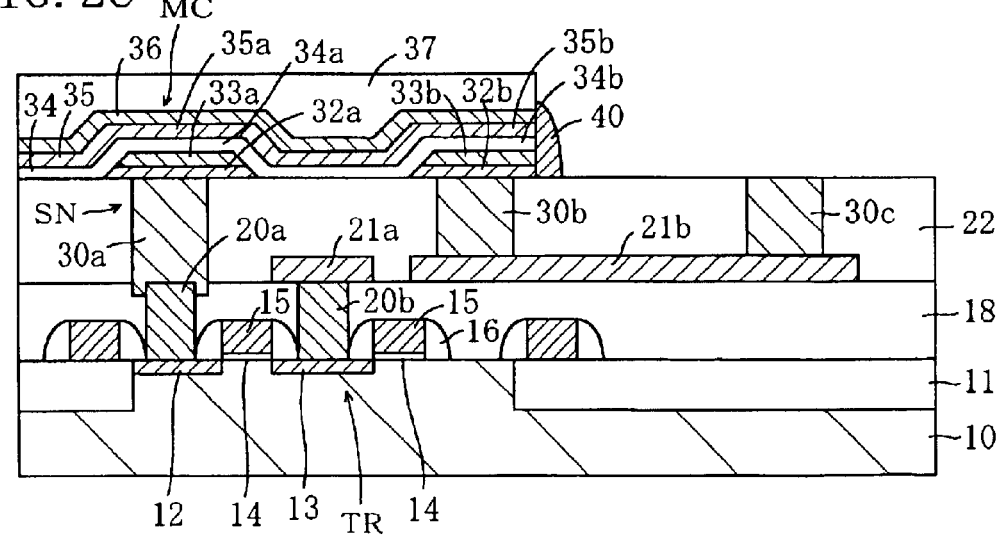

FIGS. 1(a) and 1(b) are, respectively, a cross-sectional view partly showing a structure of a memory part of, and a plan view of a structure including upper electrodes and a conductor sidewall in, a semiconductor memory device according to a first embodiment of the present invention. FIGS. 2(a) through 2(c) are cross-sectional views showing respective process steps for fabricating the semiconductor memory device of this embodiment. Hereinafter, a structure of the semiconductor memory device of this embodiment and a method for fabricating the device will be described in order. Each drawing pertaining to this embodiment shows exclusively a structure of the memory part. However, the semiconductor memory device of this embodiment is an embedded device in which logic circuit elements are provided in a logic circuit section, which is not shown in the drawings. The structure of the logic circuit elements itself has no direct bearing on the essence of the present invention and, therefore, is not shown in the drawings.

—Structure of Memory Cell—

As shown in FIG. 1(a), a memory cell in a DRAM which is the semiconductor memory device of this embodiment includes, in a surface region of a p-type Si substrate 10: an isolating insulating film 11 that surrounds an active region; and source/drain regions 12 and 13 doped with an n-type impurity and separated from each other. Part of the p-type Si substrate 10 sandwiched between the source/drain regions 12 and 13 serves as a channel region. On the active region of the Si substrate 10, a gate oxide film 14 of silicon oxide is formed between the source/drain regions 12 and 13. A gate electrode 15 (which is a part of a word line) of polysilicon is formed on the gate oxide film 14, and an oxide sidewall 16 is formed on side faces of the gate electrode 15. In this manner, the source/drain regions 12 and 13, channel region, gate oxide film 14 and gate electrode 15 constitute a memory cell transistor TR. The cross-sectional view of FIG. 1(a) shows a gate electrode 15 that does not serve as the gate of the memory cell transistor TR. However, in another cross-sectional view other than FIG. 1(a), this gate electrode 15 will serve as the gate of another memory cell transistor. Each of the gate electrodes 15 extends in a substantially orthogonal direction to the paper to be a word line of a DRAM.

A first interlevel insulating film 18 of BPSG covering the isolating insulating film 11, gate electrode 15 and oxide sidewall 16 is formed on the Si substrate 10. A lower memory cell plug 20a of W (tungsten) reaching to the source region 12 is formed through the first interlevel insulating film 18. A bit line plug 20b reaching to the drain region 13 is formed through the first interlevel insulating film 18. A bit line 21a made of a stack of W/Ti films, connected to the bit line plug 20b, and a local interconnect 21b made from the same stack of W/Ti films used for the bit line 21a are formed on the first interlevel insulating film 18. A second interlevel insulating film 22 of plasma TEOS is also formed on the first interlevel insulating film 18. An upper memory cell plug 30a, a dummy cell plug 30b, and an interconnect plug 30c reaching to the lower memory cell plug 20a, the local interconnect 21b, and the local interconnect 21b, respectively, are formed through the second interlevel insulating film 22.

A lower barrier metal 32a of TiAlN is formed on the second interlevel insulating film 22, and a lower electrode 33a of Pt is formed on the lower barrier metal 32a. A dummy barrier metal 32b of TiAlN is formed on the second interlevel insulating film 22, and a dummy lower electrode 33b is formed on the dummy barrier metal 32b. A BST ((BaSr)TiO$_3$) film 34 is formed to cover the second interlevel insulating film 22, lower electrode 33a and dummy lower electrode 33b. A Pt film 35 is formed to cover the BST film 34. An upper barrier metal 36 of TiAlN is formed to cover the Pt film 35. A hard mask 37 of SiO$_2$ is formed to cover the upper barrier metal 36. A part of the BST film 34 that is in contact with the lower electrode 33a serves as a capacitive insulating film 34a, while a part of the BST film 34 that is in contact with the dummy lower electrode 33b serves as an extension of the capacitive insulating film 34b. A part of the Pt film 35 located above the lower electrode 33a serves as an upper electrode 35a, while a part of the Pt film 35 located above the dummy lower electrode 33b serves an extension of the upper electrode 35b. The lower barrier metal 32a and the lower electrode 33a constitute a storage node SN of the DRAM memory cell. The lower electrode 33a, the capacitive insulating film 34a and the upper electrode 35a constitute a memory capacitor MC.

A conductor sidewall 40 of TiAlN is formed on side faces of the hard mask 37, upper barrier metal 36, Pt film 35 and BST film 34. As shown in FIG. 1(b), the conductor sidewall 40 surrounds the entire circumference of the Pt film 35 and the BST film 36. Especially where the dummy lower electrode 33b is present, the conductor sidewall 40 is formed on each side of the upper barrier metal 36, upper-electrode extension 35b, the capacitive-insulating-film extension 34b, dummy lower electrode 33b and dummy barrier metal 32b. That is to say, the conductor sidewall 40 electrically connects the upper-electrode extension 35b to the dummy lower electrode 33b (the dummy barrier metal 32b).

A third interlevel insulating film 41 of plasma TEOS is formed on the second interlevel insulating film 22 and the hard mask 37. A Cu interconnect 42 is buried in the third interlevel insulating film 41 to be in contact with the interconnect plug 30c.

That is to say, the structure shown in FIGS. 1(a) and 1(b) contains an effective memory cell region Rec, including the memory capacitor MC, storage node SN and memory cell transistor TR, and a dummy cell region Rdc, including the dummy lower electrode 33b, capacitive-insulating-film extension 34b, upper-electrode extension 35b and dummy cell plug 30b.

This embodiment is characterized by providing no plug which is in contact with the upper electrode 35a or the upper-electrode extension 35b (the upper barrier metal 36) but by connecting the upper electrode 35a to an upper interconnect (the Cu interconnect 42) via the conductor sidewall 40, dummy lower electrode 33b, dummy cell plug 30 and local interconnect 21b.

As shown in FIG. 1(b), a large number of memory cells share the Pt film 35 (the upper barrier metal 36) that constitutes the upper electrode 35a. Under the Pt film 35 a large number of the lower electrodes 33a (the lower barrier metals 32a) and one dummy lower electrode 33b (the dummy barrier metal 32b) are provided. Alternatively, a plurality of dummy lower electrodes 33b (the dummy barrier metals 32b) may be provided under the Pt film 35. In such a case, the upper electrode 35a is electrically connected to the dummy lower electrodes 33b so long as the dummy lower electrodes 33b (the dummy barrier metals 32b) is provided under part of the Pt film 35.

According to this embodiment, since there is no plug that is in contact with the Pt film 35 (the upper barrier metal 36) constituting the upper electrode, it is unnecessary to form a contact hole for planting a plug therein in the third interlevel insulating film 41 and the hard mask 37. Thus, unlike the structures obtained by the processes to date, the Pt film constituting the upper electrode is not exposed during the dry etching (the plasma etching) process for forming a contact hole reaching to the upper electrode. Specifically, if the Pt film is exposed and subjected to a reducing atmosphere, oxygen deficiency might be produced in the capacitive insulating film (particularly in a high-κ film) made of, for example, BST. In this case, even if the upper barrier metal of TiAlN is formed on the Pt film as in this embodiment, the upper barrier metal is unlikely to prevent oxygen deficiency from occurring in the capacitive insulating film, considering that, for example, the upper barrier metal is relatively thin and an etching process for forming a contact hole usually includes an over-etching process, and therefore there is a strong likelihood that the contact hole reaches to the upper electrode of Pt. On the other hand, in this embodiment, no contact hole is formed above the Pt film 35, thus ensuring prevention of oxygen deficiency in the capacitive insulating film 34a resulting from exposure of the Pt film to the reducing atmosphere.

In addition, since the Pt film 35 is not exposed during the process step of forming the contact hole in the interlevel insulating film, the etching process for forming the contact hole can be performed with equipment (e.g., a chamber) used for other process steps such as a process step for forming logic circuit elements. It should be noted that the lower electrode 33a of Pt, the dummy lower electrode 33b and the upper electrode 35a are formed with special equipment for forming the Pt film, so that there is inherently no risk of contamination in facilities for forming logic circuit elements.

Moreover, to reduce the number of photolithographic process steps in an embedded device process where memory and logic are combined, for example, a contact hole reaching to the Pt film is preferably formed concurrently with the formation of a contact hole reaching to a doped layer of a logic circuit element. According to this embodiment, even in such a case, it is sufficient that the contact hole reaching to the local interconnect 21b as the stack of W/Ti films is formed concurrently with the formation of a contact hole reaching to the doped layer in a logic circuit element. Thus, it is possible to prevent deterioration in transistor characteristics resulting from entering of Pt into the doped layer of the logic circuit element.

—How to Fabricate a Memory Cell—

Next, process steps for fabricating a memory cell of the semiconductor memory device of this embodiment will be described with reference to FIGS. 2(a) through 2(c).

In a process step shown in FIG. 2(a), the following process is performed. First, the isolating insulating film 11 is formed in the p-type Si substrate 10 to surround an active region. A memory cell transistor including the source/drain regions 12 and 13, gate oxide film 14, gate electrode 15, and oxide sidewall 16 is formed in the active region. This memory cell transistor is formed through well-known processes using well-known techniques including thermal oxidation, formation of a polysilicon film, patterning and ion implantation.

Next, a BPSG film is deposited over the memory cell transistor, and then annealed and planarized by a CMP (chemical/mechanical polishing) process, thereby forming the first interlevel insulating film 18. Thereafter, contact holes reaching to the source/drain regions 12 and 13, respectively, are formed through the first interlevel insulating film 18. Subsequently, an n-type polysilicon film is formed in the contact holes and on the first interlevel insulating film 18, and then planarized by a CMP process, so that the contact holes are filled with the polysilicon film, thereby forming the lower memory cell plug 20a and the bit line plug 20b, respectively.

Thereafter, a stack of W/Ti films is deposited on the first interlevel insulating film 18, and then patterned by etching, thereby forming the bit line 21a connected to the bit line plug 20b and the local interconnect 21b. The local interconnect 21b is separated from other components at this stage. In this case, in patterning the W film, termination of etching of the W film is determined by detecting the time when the surface of the Ti film is exposed, while in patterning the Ti film, the Ti film is etched on condition that the Ti film has high etching selectivity to the first memory cell plug 20a of polysilicon.

Subsequently, a plasma TEOS film is deposited over the substrate, and then planarized by a CMP (chemical/mechanical polishing) process, thereby forming the second interlevel insulating film 22. Then, contact holes reaching to the lower memory cell plug 20a and (two places on) the local interconnect 21b are formed through the second interlevel insulating film 22. Subsequently, W/TiN/Ti films are formed in the contact holes, and then planarized by a CMP process, so that each of the contact holes is filled with the W/TiN/Ti films, thereby forming the upper memory cell plug 30a connected to the lower memory cell plug 20a, the dummy cell plug 30b and the interconnect plug 30c. The dummy cell plug 30b and the interconnect plug 30c are connected to the two places on the local interconnect 21b, respectively.

Next, a TiAlN film and a Pt film are deposited in this order on the second interlevel insulating film 22, each to a thickness of about 30 nm. Then, the TiAlN film and the Pt film are patterned, thereby forming the lower barrier metal 32a connected to the upper storage node 30a on the second interlevel insulating film 22, the lower electrode 33a of Pt on the lower barrier metal 32a, the dummy barrier metal 32b connected to the dummy cell plug 30b on the second interlevel insulating film 22, and the dummy lower electrode 33b on the dummy barrier metal 32b. In this case, the Pt film is patterned on condition that the Pt film has high etching selectivity to the underlying TiAlN film, while the TiAlN film is etched on condition that the TiAlN film has high etching selectivity so as not to remove the underlying upper memory cell plug 30a of W.

Then, in a process step shown in FIG. 2(b), a BST ((BaSr)TiO$_3$) film, which covers the second interlevel insulating film 22, lower electrode 33a and dummy lower electrode 33b and has a thickness of about 30 nm, a Pt film with a thickness of about 30 nm, a TiAlN film with a thickness of about 30 nm, and a SiO$_2$ film are deposited in this order. After the SiO$_2$ film has been patterned so that the hard mask 37 is formed, the TiAlN, Pt, BST films are patterned in this order by a dry-etching process using the hard mask 37, thereby forming the upper barrier metal 36 covering the effective memory cell region Rec and the dummy cell region Rdc, the Pt film 35 including the upper electrode 35a and the upper-electrode extension 35b, and the BST film 34 including the capacitive insulating film 34a and the capacitive-insulating-film extension 34b.

Thereafter, in a process step shown in FIG. 2(c), a TiAlN film, which is a conductor film, is deposited over the substrate to a thickness of about 50 nm, and then is etched back by, for example, an anisotropic dry-etching process, thereby forming the conductor sidewall 40 on side faces of the hard mask 37, upper barrier metal 36, Pt film 35, BST film 34, dummy lower electrode 33b and dummy barrier metal 32b. In a cross-section where no dummy cell region Rdc is present, the conductor sidewall 40 covers each side face of the hard mask 37, upper barrier metal 36, Pt film 35 and BST film 34.

Subsequently, process steps including depositing and planarizing the third interlevel insulating film 41, forming a trench in the third interlevel insulating film 41 and filling in the trench with the Cu interconnect 42 are performed. (a damascene process) In this manner, the memory cell with the cross-sectional structure shown in FIG. 1(a) is obtained.

According to the fabrication method of this embodiment, it is possible to eliminate the process step of forming a contact hole reaching to the Pt film 35 (the upper barrier metal 36) through the third interlevel insulating film 41 and the hard mask 37 without increasing the number of photolithographic process steps as compared to the processes to date. Specifically, when a trench for planting an interconnect therein is formed in the third interlevel insulating film 41, for example, annealing is often performed under a reducing atmosphere in a process step of forming a Cu interconnect in general. Accordingly, if a contact hole is formed on the upper barrier metal 36, hydrogen passes through the thin upper barrier metal 36, or if the Pt film 35 is exposed during an over-etching process, hydrogen becomes in direct contact with the Pt film 35. As a result, hydrogen might pass through the Pt film 35 and eventually reach to the BST film 34. In such a case, there might arise deterioration in characteristics of the capacitive insulating film 34a such as oxygen deficiency due to loss of oxygen in the BST film 34. On the other hand, if the process step of forming a contact hole reaching to the Pt film 35 is eliminated as in this embodiment, deterioration in characteristics of the capacitive insulating film 34a due to such a reason is suppressed as intended. Furthermore, the process step of forming the Cu interconnect 42 corresponds to a process step of forming a plug reaching to the upper electrode in techniques to date. Thus, the local interconnect 21b and the interconnect contact 30c can be formed utilizing process steps for forming a memory cell. The conductor sidewall 40 can be formed without performing a photolithographic process. Accordingly, the number of photolithographic process steps does not increase as compared to the processes to date in which a plug is directly formed on the Pt film (the upper barrier metal).

In this embodiment, the upper and lower electrodes 35a and 33a are made of Pt and the upper barrier metal 36 is made of TiAlN. Alternatively, these members may be made of other conductor materials having oxidation resistance. The capacitive insulating film 34a is made of BST. Alternatively, the capacitive insulating film 34a may be made of other high-κ materials. In particular, if a perovskite-structured dielectric film whose structural formula is expressed by $ABO_3$ is used, oxygen atoms are likely to be lost by reduction. Thus, a great effect can be obtained by applying the present invention.

The present invention is not limited to embedded devices as described in this embodiment, but is applicable to semiconductor memory devices having capacitors using metal electrodes such as general-purpose DRAMs or FeRAMs.

The Cu interconnect 42 of this embodiment may be formed in such a manner that none of the local interconnect 21b made of the W/Ti films and the dummy cell plug 30b of the first embodiment is formed and that the Cu interconnect 42 is in contact with parts of the dummy lower barrier metal 32b and the dummy lower electrode 33b that extend toward right side of the drawing. This is because the upper electrode 35 is also connected to the Cu interconnect 42 in such a case. Furthermore, in this case, it is also possible to prevent deterioration in characteristics of the capacitive insulating film 34a. Accordingly, a plug is not necessarily formed under the dummy lower electrode 33b. As a result, the area of the dummy lower electrode 33b can be reduced.

Embodiment 2

Figure 3:
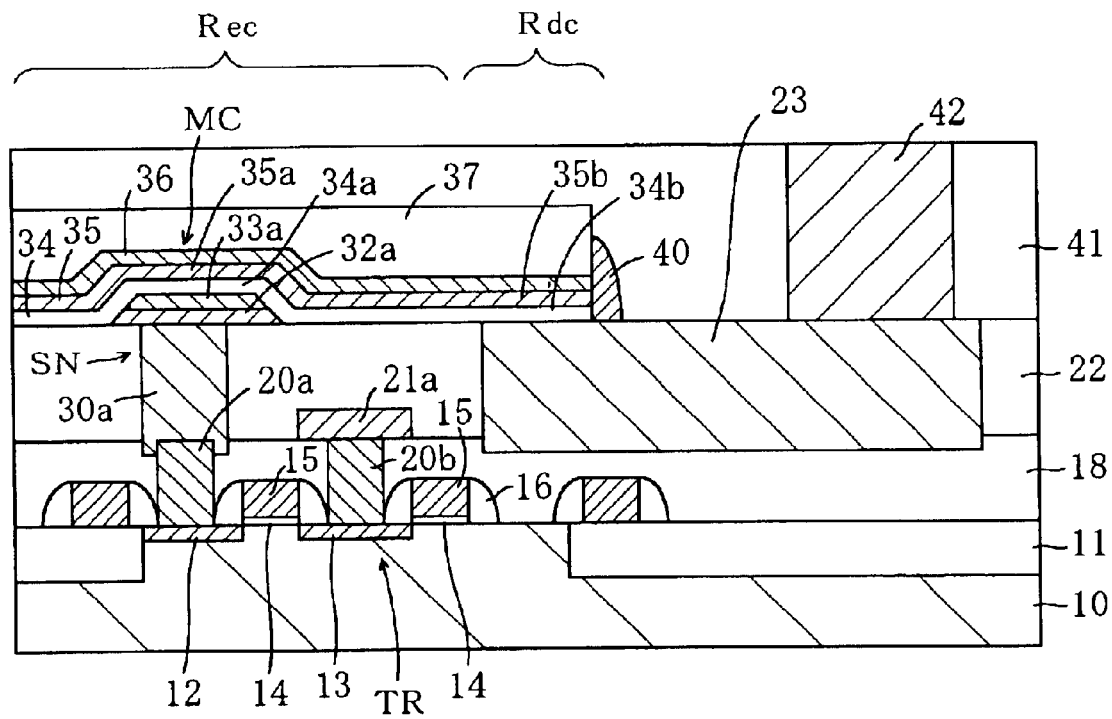
FIG. 3 is a cross-sectional view partly showing a structure of a memory part of a semiconductor memory device according to a second embodiment of the present invention.

FIG. 3 is a cross-sectional view partly showing a structure of a memory part of a semiconductor memory device according to a second embodiment of the present invention.

As shown in FIG. 3, the structure of the memory part of this embodiment is different from that of the first embodiment in that the local interconnect 21b of W/Ti films, dummy cell plug 30b, dummy lower barrier metal 32b, and dummy lower electrode 33b of the first embodiment are not provided, but a local interconnect 23 of W filling in a trench formed in the second interlevel insulating film 22 is provided. This local interconnect 23 is formed concurrently with the formation of the upper storage node 30a. Other members are identical to those shown in FIG. 1(a), and thus are identified by the same reference numerals as in FIG. 1(a).

According to this embodiment, the upper electrode 35a is electrically connected to the Cu interconnect 42 via the local interconnect 23 made of W/TiN/Ti and the conductor sidewall 40. In this embodiment, it is also unnecessary to form a contact hole reaching to the Pt film 35 (the upper barrier metal 36) that constitutes the upper electrode 35a in the third interlevel insulating film 41. Thus, according to this embodiment, it is possible to obtain advantages such as preventing deterioration in characteristics of the capacitive insulating film 34a and eliminating special equipment for forming a memory cell, as in the first embodiment.

In addition, this embodiment eliminates the necessity of the dummy lower electrode, and therefore carries an advantage that the area of the memory part can be further reduced as compared to the first embodiment.

Embodiment 3

Figure 4:
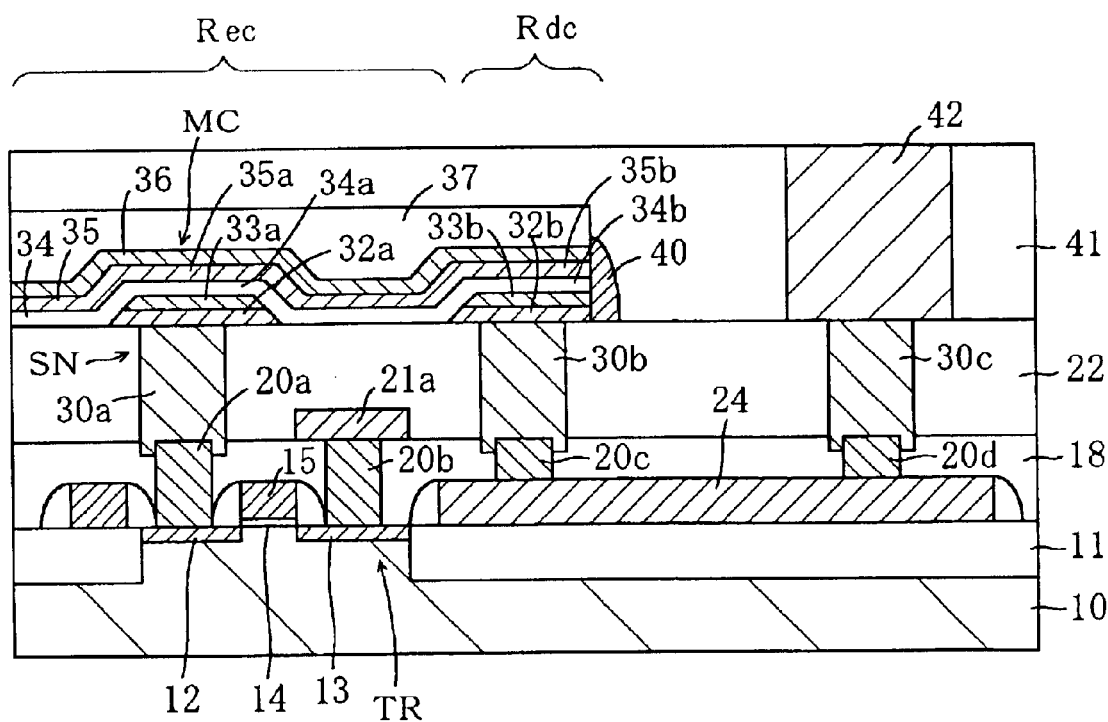
FIG. 4 is a cross-sectional view partly showing a structure of a memory part of a semiconductor memory device according to a third embodiment of the present invention.

FIG. 4 is a cross-sectional view partly showing a structure of a memory part of a semiconductor memory device according to a third embodiment of the present invention.

As shown in FIG. 4, the structure of the memory part of this embodiment is different from that of the first embodiment in that a local interconnect 24 of polysilicon is formed on the isolating insulating film 11 instead of the local interconnect 21b of W/Ti films of the first embodiment, and in that a lower dummy cell plug 20c and a lower interconnect plug 20d are formed through the first interlevel insulating film 18 to be in contact with the local interconnect 24. In this embodiment, the dummy cell plug 30b and the interconnect plug 30c are connected to the lower dummy cell plug 20c and the lower interconnect plug 20d, respectively. The local interconnect 24 is formed concurrently with the formation of the gate electrode 15. Other members are identical to those shown in FIG. 1(a), and thus are identified by the same reference numerals as in FIG. 1(a).

According to this embodiment, the upper electrode 35a is electrically connected to the Cu interconnect 42 via the dummy lower electrode 33b, dummy lower barrier metal 32b, dummy cell plug 30b, lower dummy cell plug 20c, local interconnect 24, lower interconnect plug 20d and interconnect plug 30c. In this embodiment, it is also unnecessary to form a contact hole reaching to the Pt film 35 (the upper barrier metal 36) that constitutes the upper electrode 35a in the third interlevel insulating film 41. Thus, according to this embodiment, it is possible to obtain advantages such as preventing deterioration in characteristics of the capacitive insulating film 34a and eliminating special equipment for forming a memory cell, as in the first embodiment.

Embodiment 4

Figure 5:
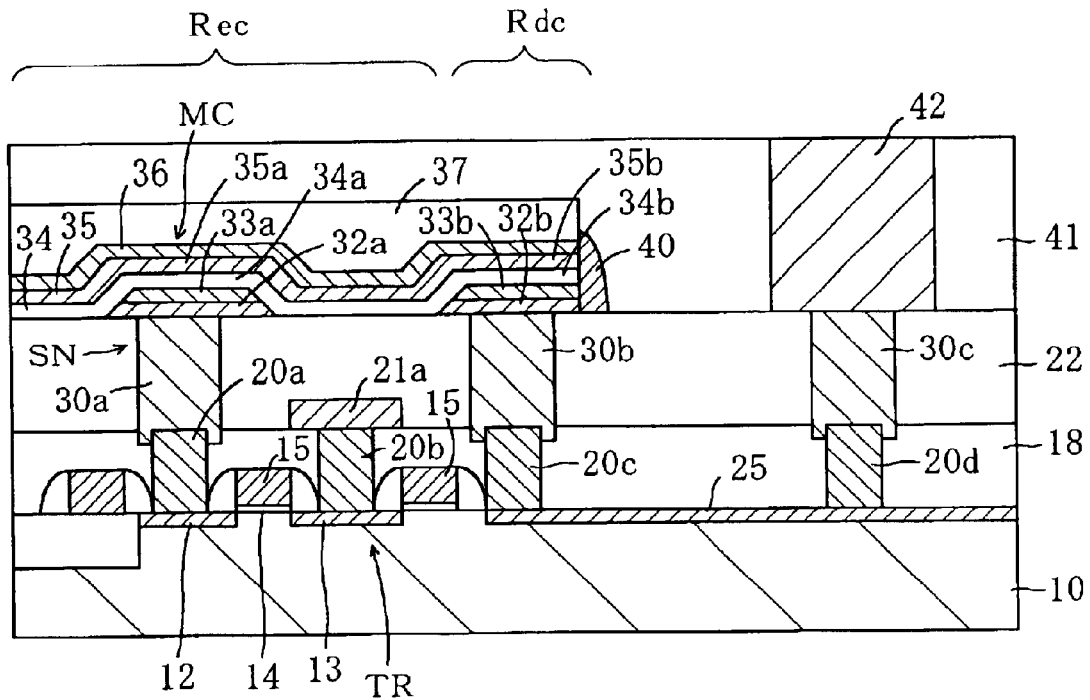
FIG. 5 is a cross-sectional view partly showing a structure of a memory part of a semiconductor memory device according to a fourth embodiment of the present invention.

FIG. 5 is a cross-sectional view partly showing a structure of a memory part of a semiconductor memory device according to a fourth embodiment of the present invention.

As shown in FIG. 5, the structure of the memory part of this embodiment is different from that of the first embodiment in that, instead of the local interconnect 21b of W/Ti films of the first embodiment, a local interconnect 25 made of a doped layer is formed in the Si substrate 10, and in that the lower dummy cell plug 20c and the lower interconnect plug 20d are formed through the first interlevel insulating film 18 to be in contact with the local interconnect 25. In this embodiment, the dummy cell plug 30b and the interconnect plug 30c are connected to the lower dummy cell plug 20c and the lower interconnect plug 20d, respectively. The local interconnect 25 is formed concurrently with the formation of the source/drain regions 12 and 13. Other members are identical to those shown in FIG. 1(a), and thus are identified by the same reference numerals as in FIG. 1(a).

According to this embodiment, the upper electrode 35a is electrically connected to the Cu interconnect 42 via the dummy lower electrode 33b, dummy lower barrier metal 32b, dummy cell plug 30b, lower dummy cell plug 20c, local interconnect 25, lower interconnect plug 20d and interconnect plug 30c. In this embodiment, it is also unnecessary to form a contact hole reaching to the Pt film 35 (the upper barrier metal 36) that constitutes the upper electrode 35a in the third interlevel insulating film 41. Thus, according to this embodiment, it is possible to obtain advantages such as preventing deterioration in characteristics of the capacitive insulating film 34 and eliminating special equipment for forming a memory cell, as in the first embodiment.

Embodiment 5

Figure 6:
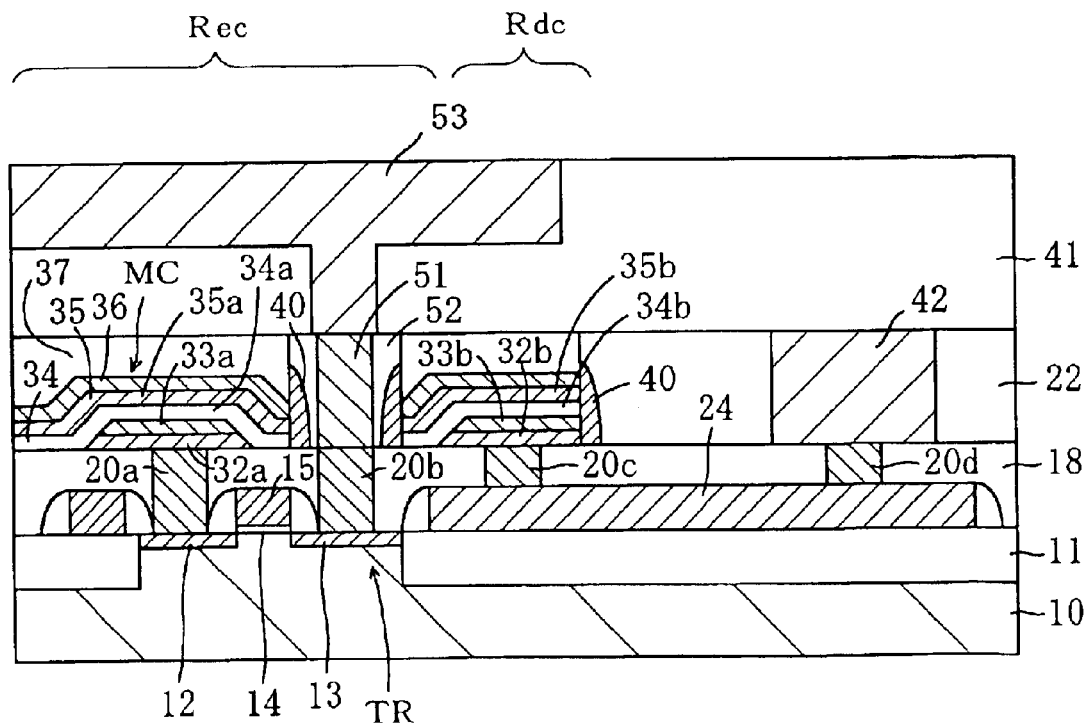
FIG. 6 is a cross-sectional view partly showing a structure of a memory part of a semiconductor memory device according to a fifth embodiment of the present invention.
Figure 7A:
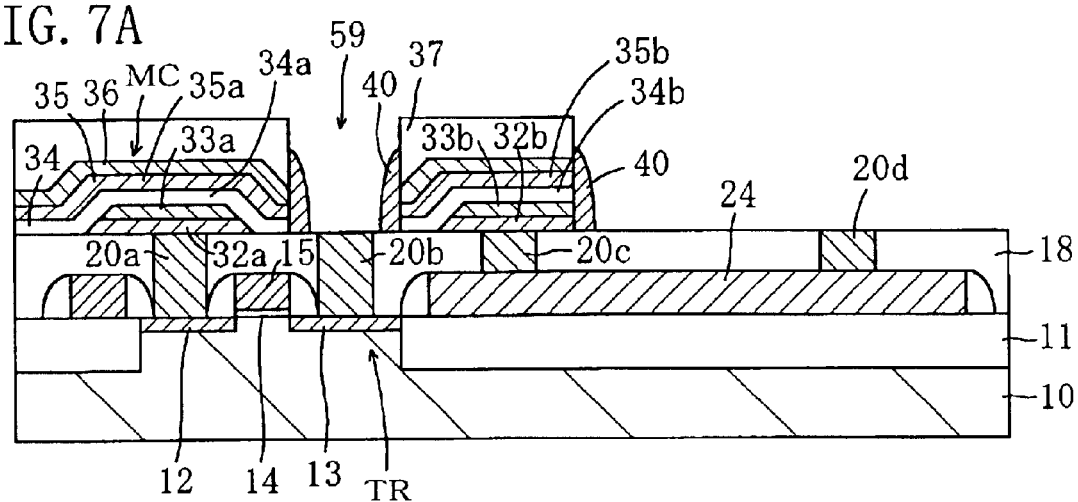
FIGS. 7(a) through 7(c) are cross-sectional views showing respective process steps for fabricating the semiconductor memory device of the fifth embodiment.
Figure 7B:
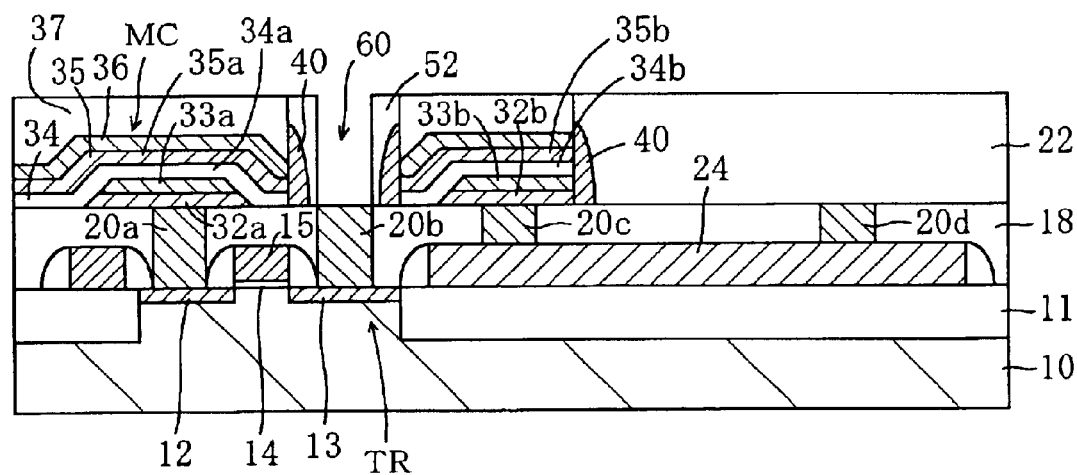
Figure 7C:
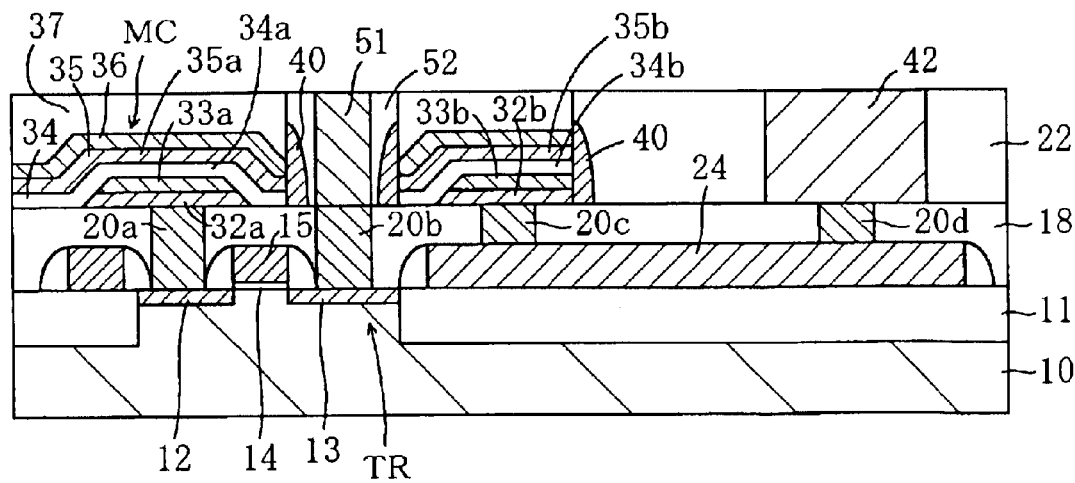

In the first through fourth embodiments, examples of how the present invention is applied to DRAM memory cell structures where a bit line is located under a capacitor have been described. In this embodiment, however, an example of how the present invention is applied to a DRAM memory cell structure where a bit line is located over a memory capacitor will be described. FIG. 6 is a cross-sectional view partly showing a structure of a memory part of a semiconductor memory device according to a fifth embodiment of the present invention. FIGS. 7(a) through 7(c) are cross-sectional views showing respective process steps for fabricating the semiconductor memory device of the fifth embodiment. Hereinafter, a structure of the semiconductor memory device of this embodiment and a method for fabricating the device will be described in order. Each drawing pertaining to this embodiment shows exclusively a structure of the memory part. However, as in the first embodiment, the semiconductor memory device of this embodiment is an embedded device in which logic circuit elements are provided in a logic circuit section, which is not shown in the drawings. The structure of the logic circuit elements itself has no direct bearing on the essence of the present invention and, therefore, is not shown in the drawings.

As shown in FIG. 6, the memory part of this embodiment is provided with a local interconnect 24 of polysilicon formed on the isolating insulating film 11 instead of the local interconnect 21b of W/Ti films of the first embodiment, and also provided with the lower dummy cell plug 20c and the lower interconnect plug 20d are formed through the first interlevel insulating film 18 to be in contact with the local interconnect 24, as in the third embodiment.

In this embodiment, the memory capacitor MC and the dummy cell are formed on the first interlevel insulating film 18. The dummy lower electrode (the dummy lower barrier metal 32b) and the Cu interconnect 42 are directly connected to the lower dummy cell plug 20c and the lower interconnect plug 20d, respectively. The local interconnect 24 and the gate electrode 15 are made from an identical polysilicon film.

Over the bit line plug 20b, an upper bit line plug 51 reaching to the bit line plug 20b through the second interlevel insulating film 22; an insulator sidewall 52 covering the side of the upper bit line plug 51; the conductor sidewall 40 of TiAlN sandwiched between the insulator sidewall 52 and a group of side faces of the hard mask 37, upper barrier metal 36, Pt film 35 and BST film 34; and a bit line 53 made of a Cu film buried in the third interlevel insulating film 41 are provided. That is to say, the DRAM memory cell has a "capacitor under bit-line" construction where the bit line is located over the memory capacitor MC.

Other members shown in FIG. 6 are identical to those shown in FIG. 1(a), and thus are identified by the same reference numerals as in FIG. 1(a).

According to this embodiment, the upper electrode 35a is electrically connected to the Cu interconnect 42 via the dummy lower electrode 33b, dummy lower barrier metal 32b, dummy cell plug 30b, lower dummy cell plug 20c, local interconnect 24 and lower interconnect plug 20d. In this embodiment, it is also unnecessary to form a contact hole reaching to the Pt film 35 (the upper barrier metal 36) that constitutes the upper electrode 35a in the third interlevel insulating film 41. Thus, according to this embodiment, even in a "capacitor under bit-line" construction, it is also possible to obtain advantages such as preventing deterioration in characteristics of the capacitive insulating film 34a and eliminating special equipment for forming a memory cell, as in the first embodiment.

Next, process steps for fabricating a memory cell of the semiconductor memory device of this embodiment will be described with reference to FIGS. 7(a) through 7(c).

In a process step shown in FIG. 7(a), the following process is performed. First, the isolating insulating film 11 is formed in the p-type Si substrate 10 to surround an active region. A memory cell transistor including the source/drain regions 12 and 13, gate oxide film 14, gate electrode 15, and oxide sidewall 16 is formed in the active region. This memory cell transistor is formed through well-known processes using well-known techniques including thermal oxidation, formation of a polysilicon film, patterning and ion implantation. In this case, the local interconnect 24 of polysilicon is formed on the isolating insulating film 11 concurrently with the formation of the gate electrode 15

Next, a BPSG film is deposited over the memory cell transistor, and then annealed and planarized by a CMP (chemical/mechanical polishing) process, thereby forming the first interlevel insulating film 18. Thereafter, contact holes reaching to the source/drain regions 12 and 13, and two places on the local interconnect 24, respectively, are formed through the first interlevel insulating film 18. Subsequently, an n-type polysilicon film is formed in the contact holes and on the first interlevel insulating film 18, and then planarized by a CMP process, so that the contact holes are filled with the polysilicon film, thereby forming the lower memory cell plug 20a, bit line plug 20b, lower dummy cell plug 20c and lower interconnect plug 20d, respectively.

Thereafter, a TiAlN film and a Pt film are deposited on the first interlevel insulating film 18, each to a thickness of about 30 nm, and then patterned, thereby forming the lower barrier metal 32a connected to the lower memory cell plug 20a on the first interlevel insulating film 18, the lower electrode 33a of Pt on the lower barrier metal 32a, the dummy barrier metal 32b connected to the lower dummy cell plug 20b on the first interlevel insulating film 18, and the dummy lower electrode 33b on the dummy barrier metal 32b. In this case, the Pt film is patterned on condition that the Pt film has high etching selectivity to the underlying TiAlN film, while the TiAlN film is patterned on condition that the TiAlN film has high etching selectivity so as not to remove the underlying lower memory cell plug 20a of polysilicon.

Then, a BST ((BaSr)TiO$_3$) film, which covers the first interlevel insulating film 18, the lower electrode 33a and the dummy lower electrode 33b and has a thickness of about 30 nm, a Pt film with a thickness of about 30 nm, a TiAlN film with a thickness of about 30 nm, and a SiO$_2$ film are deposited in this order. After the SiO$_2$ film has been patterned so that the hard mask 37 is formed, the TiAlN, Pt, BST films are patterned in this order by a dry-etching process using the hard mask 37, thereby forming the upper barrier metal 36 covering the effective memory cell region Rec and the dummy cell region Rdc, the Pt film including the upper electrode 35a and the upper-electrode extension 35b, and the BST film 34 including the capacitive insulating film 34a and the capacitive-insulating-film extension 34b. At this time, part of the hard mask 37 located over the bit line plug 20b is also removed, thereby forming an opening 59.

Thereafter, a TiAlN film, which is a conductor film, is deposited over the substrate to a thickness of about 50 nm, and then etched back by, for example, an anisotropic dry-etching process, thereby forming the conductor sidewall 40 on side faces of the hard mask 37, upper barrier metal 36, Pt film 35, BST film 34, dummy lower electrode 33b and dummy barrier metal 32b, as shown in cross-section of FIG. 7(a). It should be noted that in a cross-section where no dummy cell region Rdc is present, e.g., on the inner sidewalls of the opening 59, the conductor sidewall 40 covers each side face of the hard mask 37, upper barrier metal 36, Pt film 35, and BST film 34.

Subsequently, in a process step shown in FIG. 7(b), the second interlevel insulating film 22 is deposited, and then planarized by a CMP process until the hard mask 37 is exposed. Then, a contact hole 60 reaching to the bit line plug 20b is formed through the hard mask 37. In this case, the inner diameter of the contact hole 60 is set to smaller than that of the conductor sidewall 40 formed on the side of the opening 59 formed by the process step shown in FIG. 7(a), so that the insulator sidewall 52 is sandwiched between the side faces of the contact hole 60 and the conductor sidewall 40. Next, in a process step shown in FIG. 7(c), a trench reaching to the lower interconnect plug 20d is formed through the second interlevel insulating film 22. Thereafter, a Cu film is deposited and a CMP process is performed, to fill in the contact hole 60 and the trench formed on the lower interconnect plug 20d. In this manner, the upper bit line plug 51 and the Cu interconnect 42 are formed.

Then, a process including depositing and planarizing the third interlevel insulating film 41, forming a contact hole and a trench in the third interlevel insulating film 41, and filling in the contact hole and the trench with the Cu film is performed, for forming the bit line 53. (a dual damascene process). In this manner, the memory cell with the cross-sectional structure shown in FIG. 6 is obtained.

According to the fabrication method of this embodiment, it is possible to eliminate the process step of forming, in the hard mask 37, a contact hole reaching to the Pt film 35 (the upper barrier metal 36) that constitutes the upper electrode 35a. Therefore, as in the fabrication method of the first embodiment, deterioration in characteristics of the capacitive insulating film 34a resulting from exposure to the reducing atmosphere is suppressed as intended.

In this embodiment, the upper and lower electrodes 35a and 33a are made of Pt and the upper barrier metal 36 is made of TiAlN. Alternatively, these members may be made of other conductor materials having oxidation resistance. The capacitive insulating film 34a is made of BST. Alternatively, the capacitive insulating film 34a may be made of other high-κ materials. In particular, if a perovskite-structured dielectric film whose structural formula is expressed by ABO$_3$ is used, oxygen atoms are likely to be lost by reduction. Thus, a great effect can be obtained by applying the present invention.

The present invention is not limited to embedded devices as described in this embodiment, but is applicable to semiconductor memory devices having capacitors using metal electrodes such as general-purpose DRAMs or FeRAMs.

Embodiment 6

Figure 8:
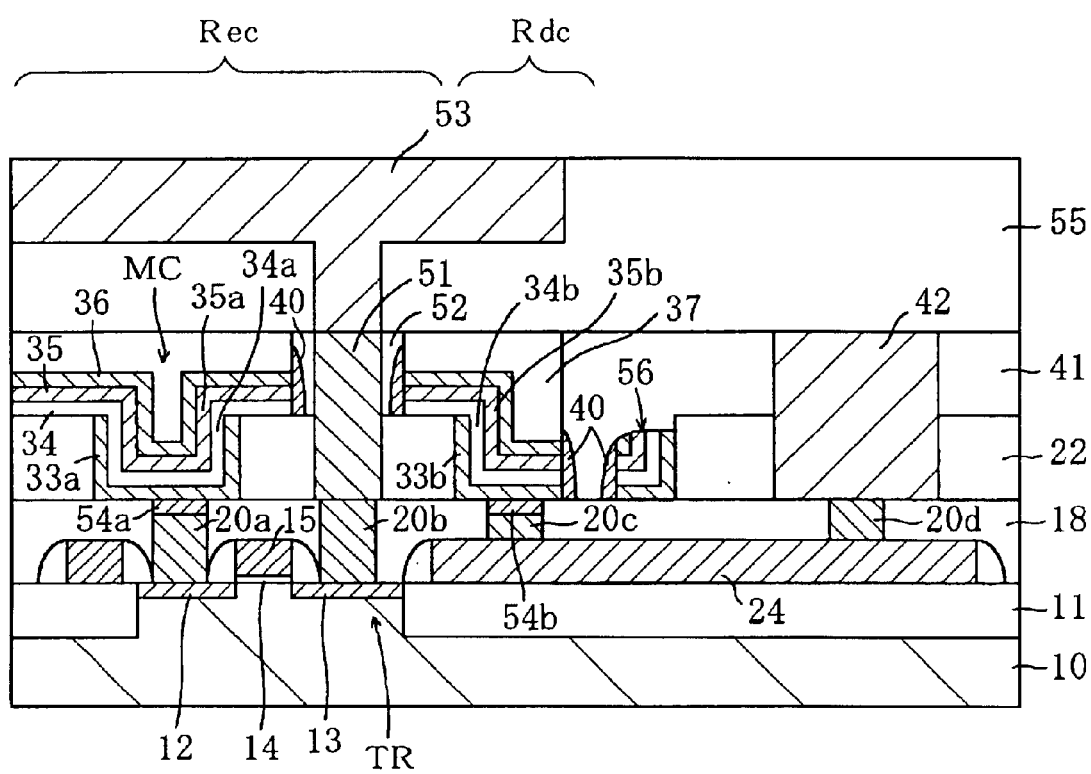
FIG. 8 is a cross-sectional view partly showing a structure of a memory part of a semiconductor memory device according to a sixth embodiment of the present invention.
Figure 9A:
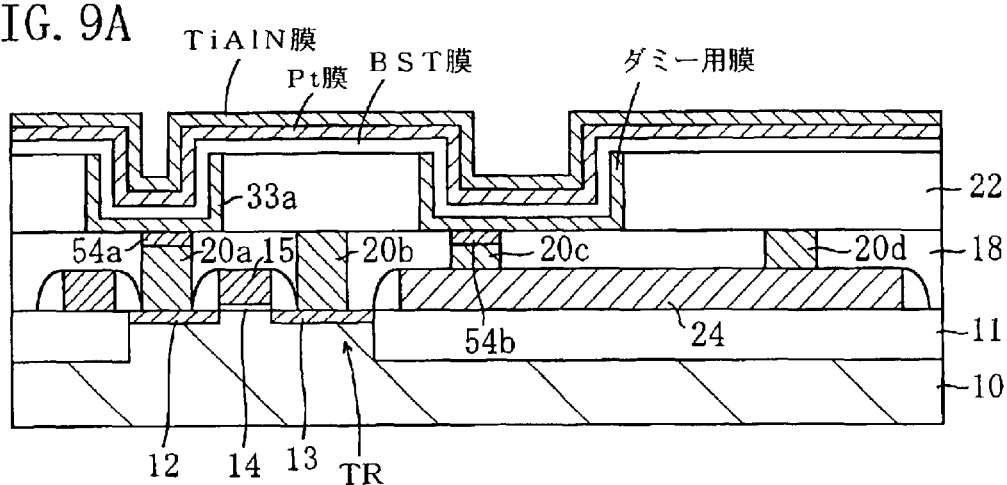
FIGS. 9(a) through 9(c) are cross-sectional views showing respective process steps for fabricating the semiconductor memory device of the sixth embodiment.
Figure 9B:
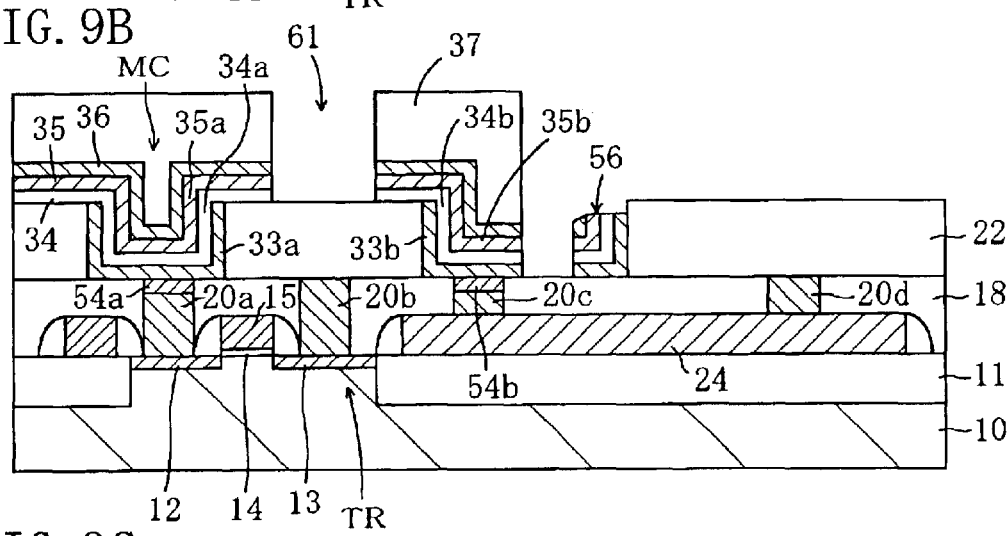
Figure 9C:
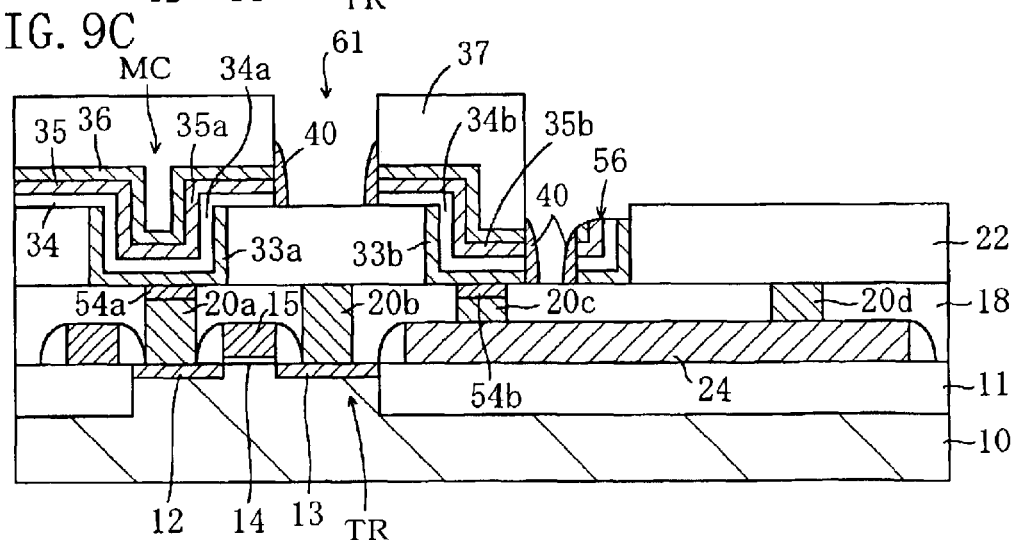

In this embodiment, an example of how the present invention is applied to a DRAM memory cell structure where a bit line is located over a memory capacitor, which is also called a "capacitor under bit-line" construction, will be described, as in the fifth embodiment. FIG. 8 is a cross-sectional view partly showing a structure of a memory part of a semiconductor memory device according to a fifth embodiment. FIGS. 9(a) through 9(c) are cross-sectional views showing respective process steps for fabricating the semiconductor memory device of the sixth embodiment. Hereinafter, a structure of the semiconductor memory device of this embodiment and a method for fabricating the device will be described in order. Each drawing pertaining to this embodiment shows exclusively a structure of the memory part. However, as in the first embodiment, the semiconductor memory device of this embodiment is an embedded device in which logic circuit elements are provided in a logic circuit section, which is not shown in the drawings. The structure of the logic circuit elements itself has no direct bearing on the essence of the present invention and, therefore, is not shown in the drawings.

As shown in FIG. 8, the memory part of this embodiment is provided with a local interconnect 24 of polysilicon formed on the isolating insulating film 11 instead of the local interconnect 21b of W/Ti films of the first embodiment, and also provided with the lower dummy cell plug 20c and the lower interconnect plug 20d that are in contact with the local interconnect 24 through the first interlevel insulating film 18 as in the third embodiment.

In this embodiment, lower barrier metals 54a and 54b of TiAlN are formed on the memory cell plug 20a and the lower dummy cell plug 20c, respectively, within the contact holes. The lower electrode 33a is formed to cover the bottom and the entire side faces of one of the openings formed in the first interlevel insulating film 22 shown in the drawings. On the other hand, in part of another opening formed in the first interlevel insulating film 22, the dummy lower electrode 33b is formed to cover the side face and the bottom of the opening. The BST film 34, Pt film 35, and upper barrier metal 36 are provided over the second interlevel insulating film 22, lower electrode 33a, and dummy lower electrode 33b. A part of the BST film 34 that is in contact with the lower electrode 33a serves as a capacitive insulating film 34a, while a part of the BST film 34 that is in contact with the dummy lower electrode 33b serves as an extension of the capacitive insulating film 34b. A part of the Pt film 35 located above the lower electrode 33a serves as an upper electrode 35a, while a part of the Pt film 35 located above the dummy lower electrode 33b serves as an extension of the upper electrode 35b. That is to say, a cylindrical memory capacitor MC and a dummy cell are formed through the first and second interlevel insulating films 18 and 22. The dummy lower electrode (the dummy lower barrier metal 32b) and the Cu interconnect 42 are directly connected to the lower dummy cell plug 20c and the lower interconnect plug 20d, respectively. The local interconnect 24 and the gate electrode 15 are made from an identical polysilicon film. The cylindrical memory capacitor MC may have various shapes such as circles, rectangles and other polygons, in plan view.

The conductor sidewall 40 of TiAlN is provided on side faces of the upper barrier metal 36, Pt film 35, BST film 34 and dummy lower electrode 33b. A sidewall 56 of stacked films, which includes: the Pt film constituting the lower electrode 33a; the BST film constituting the capacitive insulating film 34; the Pt film constituting the upper electrode 35; and the TiAlN film constituting the upper barrier metal 36, is formed on a part of the opening provided with the bit line plug dummy lower electrode 33b where this opening is not covered with the dummy lower electrode 33b. The conductor sidewall 40 is also formed on the side of this sidewall 56.

Over the bit line plug 20b, the upper bit line plug 51 reaching to the bit line plug 20b through the second and third interlevel insulating films 22 and 41; an insulator sidewall 52 covering the side of the upper bit line plug 51; and the bit line 53 made of a Cu film filling in the fourth interlevel insulating film 41 are provided. That is to say, the DRAM memory cell has a "capacitor under bit-line" construction where the bit line is located over the memory capacitor MC. Around the upper bit line plug 51, the conductor sidewall 40 is also formed on side faces of the upper barrier metal 36, upper electrode 36a and capacitive insulating film 34, so that the insulator sidewall 52 is sandwiched between the conductor sidewall 40 and the upper bit line plug 51.

Other members shown in FIG. 8 are identical to those shown in FIG. 1(a), and thus are identified by the same reference numerals as in FIG. 1(a).

According to this embodiment, the upper electrode 35a is electrically connected to the Cu interconnect 42 via the dummy lower electrode 33b, dummy lower barrier metal 32b, dummy cell plug 30b, lower dummy cell plug 20c, local interconnect 24 and lower interconnect plug 20d. In this embodiment, it is also unnecessary to form a contact hole reaching to the Pt film 35 (the upper barrier metal 36) that constitutes the upper electrode 35a in the third interlevel insulating film 41. Thus, according to this embodiment, even in a "capacitor under bit-line" construction, it is also possible to obtain advantages such as preventing deterioration in characteristics of the capacitive insulating film 34a and eliminating special equipment for forming a memory cell, as in the first embodiment.

Next, process steps for fabricating a memory cell of the semiconductor memory device of this embodiment will be described with reference to FIGS. 9(a) through 9(c).

In a process step shown in FIG. 9(a), the following process is performed. First, the isolating insulating film 11 is formed in the p-type Si substrate 10 to surround an active region. A memory cell transistor including the source/drain regions 12 and 13, gate oxide film 14, gate electrode 15, and oxide sidewall 16 are formed in the active region. This memory cell transistor is formed through well-known processes using well-known techniques such as thermal oxidation, formation of a polysilicon film, patterning and ion implantation. In this case, the local interconnect 24 of polysilicon is formed on the isolating insulating film 11 concurrently with the formation of the gate electrode 15

Next, a BPSG film is deposited over the memory cell transistor, and then annealed and planarized by a CMP (chemical/mechanical polishing) process, thereby forming the first interlevel insulating film 18. Thereafter, contact holes reaching to the source/drain regions 12 and 13 and two places on the local interconnect 24, respectively, are formed through the first interlevel insulating film 18. Subsequently, an n-type polysilicon film is formed in the contact holes and on the first interlevel insulating film 18, and then planarized by a CMP process, so that the contact holes are filled with the polysilicon film. After a dry-etching process for removing respective parts of the polysilicon film buried in the contact holes, a TiAlN film is deposited over the substrate and a CMP process is performed. In this manner, a TiAlN layer including the lower barrier metal 54a and the lower dummy barrier metal 54b on the respective contact plugs is formed.

A plasma TEOS film is deposited over the first interlevel insulating film 18, and then planarized by a CMP process, thereby forming the second interlevel insulating film 22. Then, as shown in the drawing, two openings are formed through the second interlevel insulating film 22 such that the lower memory cell plug 20a and the dummy cell plug 20d are exposed.

Next, after a Pt film has been deposited on the substrate to a thickness of about 30 nm, a CMP process is performed such that the upper surface of the second interlevel insulating film 22 is exposed, thereby forming the lower electrode 33a and the dummy lower electrode 33b with the Pt film left on the bottoms and the sides of the two openings shown in the drawing. Subsequently, BST ((BaSr)TiO$_3$), Pt, and TiAlN films are deposited in this order to thicknesses of about 30 nm, 30 nm, 17 nm, respectively.

Then, in a process step shown in FIG. 9(b), the hard mask 37 is formed to cover the effective memory cell region Rec and the dummy cell region Rdc and not to cover other regions. In this case, the hard mask 37 has an opening 61 in a region located above the lower bit line plug 20b. Thereafter, the TiAlN film, Pt film, and BST film are patterned in this order by a dry-etching process using the hard mask 37 as an etching mask, thereby forming the upper barrier metal 36 covering the effective memory cell region Rec and the dummy cell region Rdc, the Pt film 35 including the upper electrode 35a and the upper-electrode extension 35b, and the BST film 34 including the capacitive insulating film 34a and the capacitive-insulating-film extension 34b. At this time, respective parts of the TiAlN, Pt, and BST films located in regions other than the effective memory cell region Rec and the dummy cell region Rdc are removed, while the sidewall 56 of stacked films including the TiAlN, Pt and BST films is formed on the side of the second interlevel insulating film 22.

Next, in a process step shown in FIG. 9(c), a TiAlN film, which is a conductor film, is deposited over the substrate to a thickness of about 50 nm, and then is etched back by, for example, an anisotropic dry-etching process, thereby forming the conductor sidewall 40 on side faces of the hard mask 37, upper barrier metal 36, Pt film 35, BST film 34, and dummy lower electrode 33b in cross-section shown in FIG. 9(c). In a cross-section where no dummy cell region Rdc is present, e.g., on the inner sidewall of the opening 61, the conductor sidewall 40 covers side faces of the upper barrier metal 36, Pt film 35, BST film 34 and Pt film 35. In the opening 61 of the hard mask 37, the conductor sidewall 40 of TiAlN is formed on side faces of the upper barrier metal 36, Pt film 35 and BST film 34.

Subsequently, the third interlevel insulating film 41 is deposited, and then planarized by a CMP process. After a contact hole reaching to the bit line plug 20b has been formed through the third and second interlevel insulating films 41 and 22, the insulator sidewall 52 is formed on the side of the contact hole. Thereafter, a contact hole reaching to the lower interconnect plug 20d is formed through the third and second interlevel insulating films 41 and 22. Then, a Cu film is deposited and a CMP process is performed, so that the contact holes are filled in with the Cu film. In this manner, the upper bit line plug 51 and the Cu interconnect 42 are formed.

Then, process steps including depositing and planarizing the fourth interlevel insulating film 55, forming a contact hole and a trench in the fourth interlevel insulating film 55 and filling in the contact hole and the trench with the Cu film are performed, for forming the bit line 53 (a dual damascene process). In this manner, the memory cell with the cross-sectional structure shown in FIG. 8 is obtained.

According to the fabrication method of this embodiment, it is possible to eliminate the process step of forming a contact hole reaching to the Pt film 35 (the upper barrier metal 36) that constitutes the upper electrode 35a in the third interlevel insulating film 41. Therefore, as in the fabrication method of the first embodiment, deterioration in characteristics of the capacitive insulating film 34a resulting from exposure to the reducing atmosphere can be suppressed as intended.

In addition, since the memory capacitor MC has a cylindrical structure, capacity per unit area of the substrate increases. As a result, DRAMs in which memory cells are densely arranged can be implemented.

In this embodiment, the upper and lower electrodes 35a and 33a are made of Pt and the upper barrier metal 36 is made of TiAlN. Alternatively, these members may be made of other conductor materials having oxidation resistance. The capacitive insulating film 34a is made of BST. Alternatively, the capacitive insulating film 34a may be made of other high-κ materials. In particular, if a perovskite-structured dielectric film whose structural formula is expressed by $ABO_3$ is used, oxygen atoms are likely to be lost by reduction. Thus, a great effect can be obtained by applying the present invention.

The present invention is not limited to embedded devices as described in this embodiment, but is applicable to semiconductor memory devices having capacitors using metal electrodes such as general-purpose DRAMs or FeRAMs.

In this embodiment, an example of how the structure of the cylindrical memory capacitor is applied to a memory cell with a "capacitor under bit-line" construction has been described. However, the structure of the cylindrical memory capacitor shown in FIG. 9 is applicable to a memory cell with a "capacitor over bit-line" construction.

Other Embodiments

In the fifth and sixth embodiments, a polysilicon film to be a gate interconnect is used as a local interconnect. However, structures similar to those described in the second and fourth embodiments are applicable to DRAM memory cells with a "capacitor under bit-line" construction as in the fifth and sixth embodiments. Specifically, in a DRAM memory cell with a "capacitor under bit-line" construction, the local interconnect 23 made of a buried W film shown in FIG. 3 and the local interconnect 25 made of the doped layer shown in FIG. 5 may be provided.

In the embodiments, examples of how the present invention is applied to an embedded semiconductor memory device provided with a DRAM and logic circuits. However, the present invention is not limited to these embodiments, but is applicable to general-purpose DRAMs.

The present invention is also applicable to semiconductor memory devices such as FeRAM using a ferroelectric film as a capacitive insulating film. In such a case, the semiconductor memory device may be either general-purpose memory devices or embedded device where memory and logic are combined.

In the second through sixth embodiments, the conductor sidewall 40 completely covers the entire side faces of the Pt film 35 and the BST film 34 to surround the entire circumference of the Pt film 35 as in the structure shown in FIG. 1(b). For this structure, functions as a barrier layer, e.g., completely preventing impurities from entering the capacitive insulating film 34a, can be highly achieved. However, in the present invention, it is unnecessary for the conductor sidewall 40 to cover the entire side faces of the Pt film 35 and the BST film 34 to surround the entire circumference of the Pt film 35.

In the first through fifth embodiments, the hard mask is formed over the upper electrode. Alternatively a resist mask may be formed instead of the hard mask, depending on conductor materials used for the upper and lower electrodes. It should be noted, however, that if the hard mask is used, it is possible to suppress deformation of the mask pattern during an etching process, thus improving accuracy in patterning.

The present invention ensures that the upper electrode is electrically connected to an upper interconnect without exposing the upper electrode. Therefore, it is possible to implement a semiconductor memory device in which deterioration in characteristics of a capacitive insulating film is suppressed.

INDUSTRIAL APPLICABILITY

The present invention is applicable to semiconductor devices in which general-purpose DRAMs, DRAMs, FeRAMs and like memories are combined with logic circuits.

What is claimed is:

1. A semiconductor memory device comprising:

a memory capacitor, which is formed on an insulating layer over a semiconductor substrate and includes a lower electrode, an upper electrode and a capacitive insulating film sandwiched between the lower electrode and the upper electrode;

an extension of the upper electrode and an extension of the capacitive insulating film extending respectively from the upper electrode and the capacitive insulating film of the memory capacitor;

a dummy conductor member formed to be partly located under the upper-electrode extension and the capacitive-insulating-film extension;

a conductor sidewall formed on side faces of the upper-electrode extension and the capacitive-insulating-film extension and connected to the dummy conductor member; and an upper interconnect electrically connected to the dummy conductor member.

2. The semiconductor memory device of claim 1, characterized in that:

the conductor sidewall covers the side faces of the upper-electrode extension and the capacitive-insulating-film extension to surround the entire circumference of films that include the upper electrode and extension thereof, and the capacitive insulating film and extension thereof respectively.

3. The semiconductor memory device of claim 1 or 2, characterized in that:

the dummy conductor member is a dummy lower electrode, the dummy lower electrode and the lower electrode being made from an identical conductor film; and the conductor sidewall electrically connects the upper-electrode extension to the dummy lower electrode.

4. The semiconductor memory device of claim 3, characterized by including:

a bit line formed under the memory capacitor with the insulating layer sandwiched between the bit line and the memory capacitor;

a local interconnect, the local interconnect and the bit line being made from an identical conductor film; and a conductor plug formed through the insulating layer to connect the dummy lower electrode to the local interconnect.

5. The semiconductor memory device of claim 3, characterized by including:

an isolating insulating film formed in the semiconductor substrate under the insulating layer;

a memory cell transistor formed in a region of the semiconductor substrate surrounded by the isolating insulating film, the memory cell transistor including a gate electrode and doped layers defined within the semiconductor substrate below the gate electrode to horizontally sandwich the gate electrode therebetween;

a local interconnect formed on the isolating insulating film, the local interconnect and the gate electrode being made from an identical conductor film; and a conductor plug formed through the interlevel insulating film to be connected to the local interconnect.

6. The semiconductor memory device of claim 3, characterized by including:

a memory cell transistor formed in a region of the semiconductor substrate, the memory cell transistor including a gate electrode and doped layers defined within the semiconductor substrate below the gate electrode to horizontally sandwich the gate electrode therebetween;

a local interconnect made of another doped layer to be separated from the doped layers defined within the semiconductor substrate; and a conductor plug formed through the insulating film and connected to the local interconnect.

7. The semiconductor memory device of claim 1 or 2, characterized in that:

the dummy conductor member is a local interconnect made of a conductor film filling in a trench that is formed in the insulating layer.

8. The semiconductor memory device of claim 1 or 2, characterized in that:

the dummy conductor member is a dummy lower electrode, the dummy lower electrode and the lower electrode being made from an identical conductor film;

the conductor sidewall is in contact with the upper-electrode extension and the dummy lower electrode; and the upper interconnect is in contact with the dummy lower electrode.

9. The semiconductor memory device of claim 1, characterized in that: the lower electrode, the capacitive insulating film and the upper electrode of the memory capacitor are cylindrical.

10. A method for fabricating a semiconductor memory device including a memory capacitor and an upper interconnect, the memory capacitor including a lower electrode, an upper electrode and a capacitive insulating film sandwiched between the lower and upper electrodes, the upper interconnect being electrically connected to the upper electrode of the memory capacitor, the method comprising the steps of:

a) forming a first conductor film on an insulating layer over a semiconductor substrates and then patterning the first conductor film to form the lower electrode and a film for a dummy lower electrode in mutually separated positions;

b) forming a dielectric film covering the lower electrode and the dummy film;

c) forming a second conductor film covering the dielectric film;

d) forming, over the second conductor film, an etching mask covering the whole of the lower electrode and part of the dummy film;

e) patterning the second conductor film, the dielectric film and the dummy film, thereby forming the capacitive insulating film and an extension of the capacitive insulating film from the dielectric film, forming the upper electrode and an extension of the upper electrode from the second conductor film, and forming a dummy lower electrode from the dummy film; and f) depositing a third conductor film over a substrate and then anisotropically etching back the third conductor film, thereby forming a conductor sidewall covering exposed parts of respective side faces of the second conductor film, the dielectric film and the dummy lower electrode, after the step e) has been performed.

11. The method of claim 10, characterized in that in the step d), a hard mask is formed as the etching mask.

12. The method of claim 10, characterized by including, before the step a) is performed, the steps of:

forming an insulating film for forming steps therein on the insulating layer; and forming, in the insulating film for forming steps, a first opening in which the memory capacitor is to be formed, and a second opening in which the dummy lower electrode is to be formed;

wherein in the step a), the lower electrode is formed on the side and the bottom of the first opening, and the dummy lower electrode is formed on the side and the bottom of the second opening, and wherein in the step d), the etching mask is formed to cover only part of the second opening.

* * * * *